United States Patent [19]

Fedele

[11] 3,845,359

[45] Oct. 29, 1974

[54] CIRCUIT BOARD ANCHOR HAVING CONSTRAINED DEFORMABLE STRUT

[76] Inventor: Daniel E. Fedele, 3007 N. Arlington Ave., Santa Susana, Calif. 93063

[22] Filed: Oct. 17, 1973

[21] Appl. No.: 407,240

[52] U.S. Cl. ........ 317/101 DH, 211/41, 339/75 MP
[51] Int. Cl. ........ H02b 1/02
[58] Field of Search ......... 317/101 DH; 339/17 L, 339/17 LM, 75 MP; 211/41; 52/499, 502

[56] References Cited

UNITED STATES PATENTS 2,881,404 4/1959 Kamm ........ 339/75 MP

FOREIGN PATENTS OR APPLICATIONS 1,109,701 4/1968 Great Britain ........ 317/101 DH

OTHER PUBLICATIONS

Schuster, "8 More Printed Circuit Guides" Product Engineering, June 10, 1963 pp. 96–97.

*Primary Examiner*—David Smith, Jr.
*Attorney, Agent, or Firm*—Fulwider, Patton, Rieber, Lee & Utecht

[57] ABSTRACT

A circuit board anchor of the type which may be utilized to anchor the opposite ends of a circuit board in a circuit board mounting box, each anchor including an elongated beam formed with a central chamber opening to one side and having retainers at its opposite ends defining the opposite ends of such chamber. A snake shaped deformable strut is received in the chamber and is formed with a pair of humps projecting transversely from the open side of the chamber with such humps being deformable to further project from such chamber. An axial compressing device is mounted in one of the retainers and is operable to shift axially and compress the strut to deform such strut and further project the humps from such chamber to urge an adjacent circuit board against retaining structure formed by such box to frictionally hold such circuit board securely in position.

10 Claims, 8 Drawing Figures

PATENTED OCT 29 1974

SHEET 2 OF 2

3,845,359

CIRCUIT BOARD ANCHOR HAVING CONSTRAINED DEFORMABLE STRUT

BACKGROUND OF THE INVENTION

1. Field of the Invention

The present invention relates to an anchor for anchoring circuit boards in a circuit board mounting box.

2. Description of the Prior Art

Since invention of integrated circuits, circuit boards have become extremely popular for mounting individual integrated circuit chips thereon with the circuitry between different chips being formed by electrically conductive leads printed on such circuit boards. Circuit boards are frequently mounted from an upwardly opening circuit board mounting box with the bottom wall of such box being formed with projecting connector prongs which mate with the sockets formed in the circuit boards. Consequently, it is desirable to positively locate the circuit boards in such box to provide for accurate alignment between the sockets in such circuit boards and the connector prongs projecting from the bottom of such box. Further, with the high density of circuit boards in such box, heat generated upon energization of the circuits may pose a problem thus making conduction thereof away from the respective circuit boards desirable.

Printed circuit board retainers have been proposed which include elongated channels mounted on the opposite walls of a circuit board mounting box and formed with resilient flanges that define one wall of a circuit board-receiving opening to thereby bias such circuit board in position as it is fitted thereinto from one end thereof. A retainer of this type is shown in U.S. Pat. No. 3,186,554. Such circuit board retainers suffer the shortcoming that in order to provide the desired frictional retaining force, the flexible wall must have such a high spring rate that insertion of the circuit board is rendered difficult and shavings are scraped from such circuit boards during mounting thereof, thus depositing such shavings in the mounting box and interfering with mounting of such circuit boards and subsequent operation thereof. Further, snake-like retaining springs have been proposed for urging axially against the ends of circuit boards to hold them in position. Springs of this type are shown in U.S. Pat. No. 3,550,062. However, such springs have not been proposed for receipt in a chamber which receives axially compressing devices for compressing such springs to urge them transversely against the side of a circuit board.

Further, circuit board boxes have been provided which include parallel upstanding flanges projecting from the opposite side walls and spaced throughout the length of such box for receipt thereadjacent of the opposite extremities of parallel circuit boards. A circuit board anchor has been proposed in the form of an elongated housing received adjacent the respective circuit boards and between such flanges and which has its opposite ends cut on a slant for receipt there-against of wedge shaped wedges. Axial bores are formed in such wedges and through the housing for receipt therethrough of an elongated screw, the bore of one of the wedges being threaded for receipt of such screw. Consequently, the opposite extremities of the circuit board can be inserted in the space between the respective flanges, the housing then received adjacent the opposite ends thereof and such screw tightened to draw the wedges against the opposite ends of the housing to cause such wedges to engage the respective wedge surface and slide transversely with respect to the housing upon continued tightening of the screw to thereby shift the respective wedges transversely with respect to the housing to fully fill the space between the adjacent flange and the circuit board to thereby wedge the circuit board firmly in position. Such anchoring wedges suffer the shortcoming that they are extremely expensive to manufacture to provide for proper operation thereof.

SUMMARY OF THE INVENTION

The circuit board anchor of the present invention is characterized by a housing in the form of a beam formed with an elongated chamber which opens to one side thereof, the opposite ends of such beam being formed with retainers that define the opposite ends of such chamber. An elongated deformable strut is received in such chamber and is formed with at least one transversely extending hump projecting from the open side of the chamber, the strut being sufficiently deformable to project such hump a predetermined distance transversely from the open side of such chamber. An axial compression device is mounted on one of the retainers and is operable to compress the deformable strut axially to deform such strut and project such hump the predetermined distance from the open side of the chamber. Consequently, the circuit board may be placed in a mounting box having flanges spaced along the opposite walls thereof to define a narrow space between adjacent flanges and the anchor then inserted adjacent the opposite ends of such circuit board to be received between such circuit board and the respective flanges. The compression device may then be operated to axially compress the strut to project such hump transversely from the open side of the chamber to engage the hump with the circuit board to thereby wedge the captive end of the circuit board firmly in position thereby preventing dislodgement upon subjection to vibration and providing for efficient heat transfer from such circuit board to the adjacent flange.

The objects and advantages of the present invention will become apparent from a consideration of the following detailed description when taken in conjunction with the accompanying drawings.

DESCRIPTION OF THE PREFERRED EMBODIMENTS

Figures 4, 7:
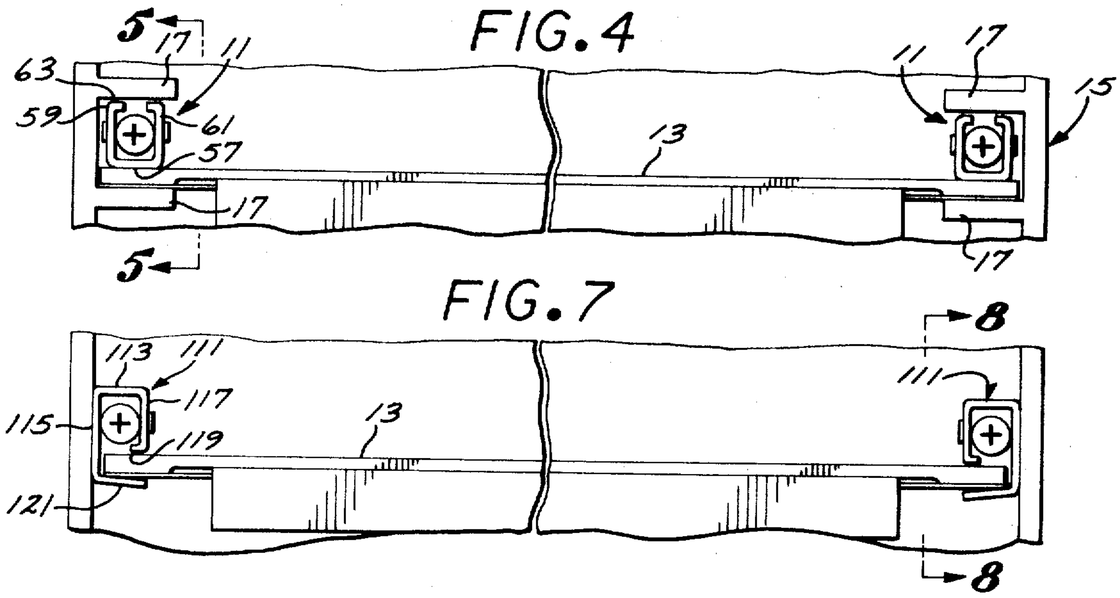
FIG. 4 is a broken partial top view, in enlarged scale, of the circuit board mounting box shown in FIG. 1 and depicting the first embodiment of the circuit board anchor of the present invention.
FIG. 7 is a broken partial top view, in enlarged scale, of the circuit board mounting block shown in FIG. 1 and depicting the second embodiment of the circuit board anchor of the present invention.
Figure 5:
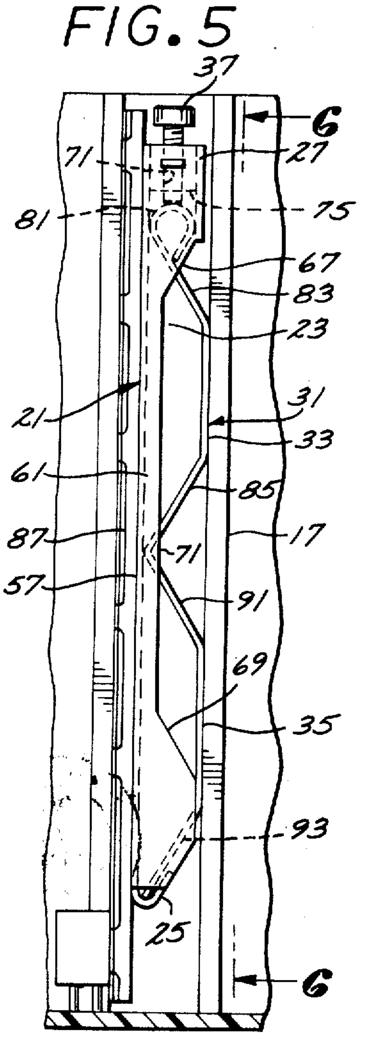
FIG. 5 is a longitudinal sectional view, in enlarged scale, taken along the line 5—5 of FIG. 4.
Figure 6:
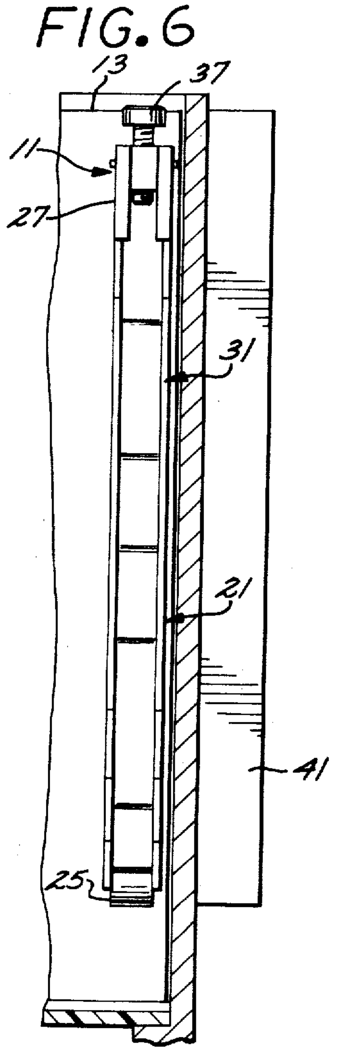
FIG. 6 is a transverse sectional view taken along the line 6—6 of FIG. 5.

Referring to FIGS. 4, 5 and 6, the circuit board anchors, generally designated 11, depicting the first embodiment of the present invention may be utilized to mount circuit boards 13 in a circuit board mounting box, generally designated 15, and formed on its opposite side walls with a plurality of equally spaced, upstanding flanges 17 which define therebetween spaces for receipt of the opposite extremities of such circuit boards. The circuit board anchors 11 include, generally, housings in the form of elongated beams 21 which are formed with elongated chambers 23 opening to one side thereof, such beams 21 being formed on their opposite ends with retainers 25 and 27 defining the ends of such chamber 23. Received within the chamber 23 is an elongated snake shaped strut spring, generally designated 31, which is formed with a pair of humps 33 and 35 that project transversely from the open side of the chamber 23 for engagement with the adjacent flange 17. A compression screw 37 is screwed through the upper retainer 27 for selectively compressing the strut spring 31 axially to deform such spring and project the humps 33 and 35 greater distances transversely from the open side of the chamber 23 to wedge against the adjacent flange 17. Consequently, the anchors 11 may be secured to the respective opposite ends of the circuit boards 13, as by riveting to such boards, and the opposite extremities of such boards and the anchors slid into the space between adjacent flanges 17. Subsequent tightening of the compression screw 37 then compresses the snake shaped strut spring 31 axially to buckle such spring and force the humps 33 and 35 against the adjacent flange 17 to wedge the opposite extremities of the circuit boards 13 firmly in position.

Conventionally, the circuit board mounting boxes 15 are constructed of aluminum or other material possessing high coefficience of heat transfer to thereby facilitate rapid conduction of heat away from the circuit boards 13. To further enhance cooling of the box 15, vertical heat dissipation fins 41 are formed exteriorally of the side walls of such box.

The circuit boards 13 normally include raised ridges 45 (FIG. 3) having strips 47 of heat conductive material, such as metal, disposed in an overlying position thereon for receipt thereagainst of electrical components 49 and integrated circuit chips 51 to thereby facilitate conduction of heat away from such components during operation thereof. The heat-conducting strips 47 normally project to the opposite ends of the circuit boards 13 to join with vertically extending borders 53 projecting coextensive with the mounting flanges 17 to make good physical contact therewith to form a low resistance heat barrier to facilitate conduction of heat away from such circuit boards and into such flanges 17 for cooling of the circuit boards.

The anchor housings 21 may be constructed of metal or plastic and are generally channel shaped and are formed with a back wall 57 (FIG. 4) having a pair of side walls 59 and 61 projecting therefrom, the upper portion of such side walls being turned inwardly at their front extremities to form respective lips 63 and 65 at the front of the upper retainer 27. Referring to FIG. 5, the side walls 59 and 61 are cut back along slopes 67 and 69 to form a central cut back portion 71. The bottom end of the back wall 57 is turned outwardly and upwardly to form the lower retainer 25.

Received within the upper retainer 27 is a fitting 75 formed with a through bore 77 which is threaded for screwably receiving the shank of the screw 37.

Referring to FIG. 5, the strut spring 31 is formed on its upper end with a turned back curl 81 and slopes downwardly and outwardly therefrom to form an inclined truss section 83 which projects at an angle of approximately 30° to the back wall 57 and then turns to project vertically downwardly to form the upper hump 33 and then turns to angle inwardly forming a second truss section 85 projecting at an angle of approximately 30° to the back wall 57 and then turning to form a turnback 87 abutting such back wall and to then project downwardly and outwardly at an angle of approximately 30° to the back wall to form a third truss section 91 which joins with the upper end of the lower hump 35 and then finally bends inwardly to form a lower truss section 93, the end of which is received in the turned back lower retainer 25.

Figures 1, 2, 3:
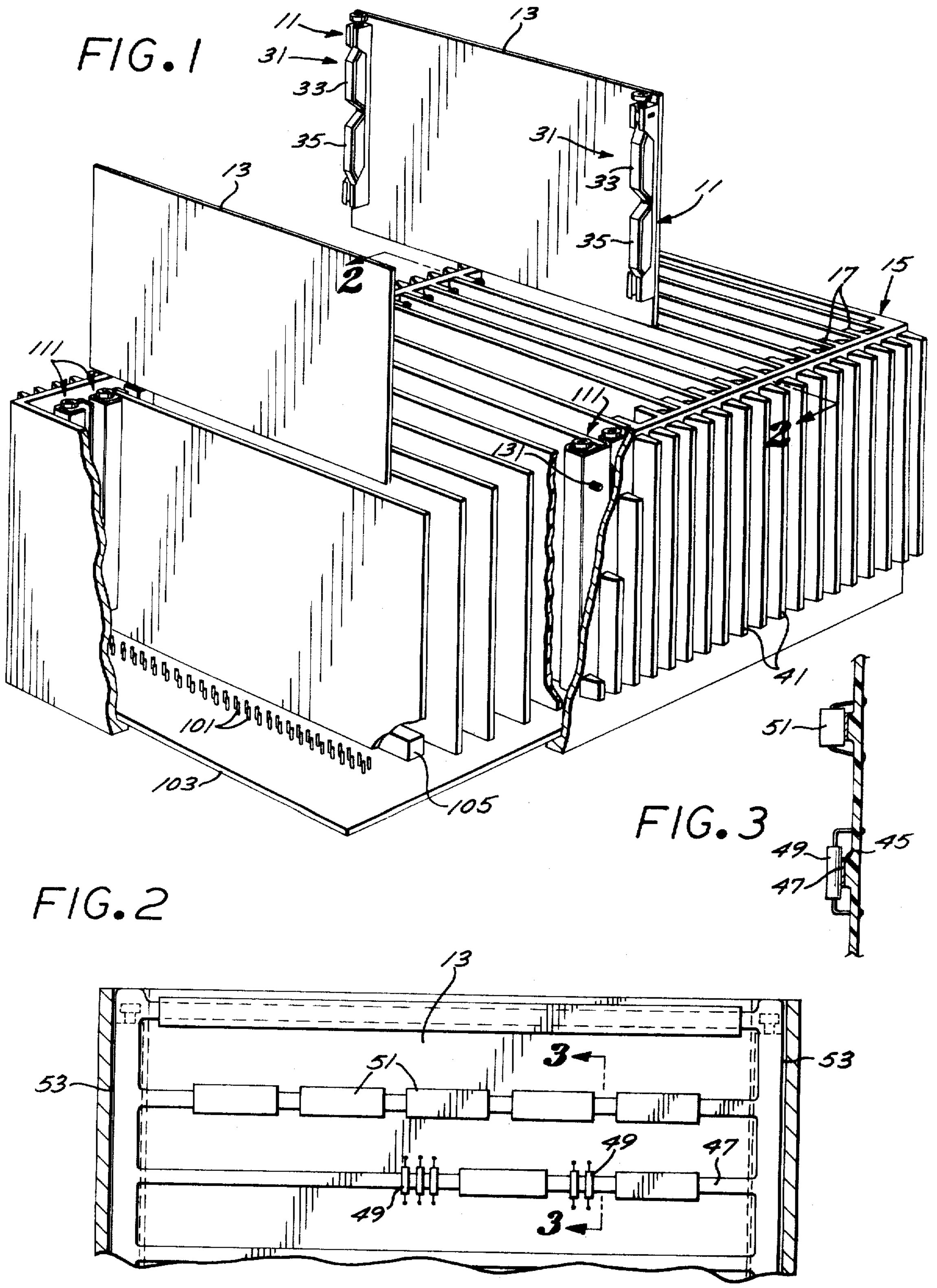
FIG. 1 is a perspective view, partially broken away, of a circuit board mounting box having circuit boards anchored thereto by means of circuit board anchors forming first and second embodiments of the present invention.
FIG. 2 is a transverse sectional view taken along the line 2—2 of FIG. 1.
FIG. 3 is a transverse sectional view, in enlarged scale, taken along the line 3—3 of FIG. 2.

In the arrangement shown in FIG. 1, the circuit board mounting box 15 is conveniently depicted as having the rearward portion of its opposite side walls formed with inwardly projecting upstanding mounting flanges 17. Connector plugs 101 project upwardly from the bottom wall 103 at locations spaced a sufficient distance from the respective flanges 17 for plugging into receptive sockets formed in socket bars 105 mounted on the lower edges of each one of the circuit boards 13.

Consequently, in operation the respective circuit boards 13 all have anchors 11 affixed to the opposite ends thereof and are fitted into the box 15 with their opposite extremities and the anchors carried therefrom received between adjacent flanges 17 with the respective socket bars 105 mating with the respective arrays of connector prongs 101 to complete the circuit to the respective circuit board 13. In this regard, the humps 33 and 35, in their relaxed positions, should provide a few hundredths of an inch play so the boards 13 can be shifted slightly with respect to the electrical prongs 101 to enable convenient alignment therewith.

Subsequent tightening of the respective compression screws 37 urges the upper extremities of the respective springs 31 downwardly and the bottom extremities of such springs are held captive against downward shifting by means of the respective retainers 25 (FIG. 5). Such downward shifting of the upper extremities of the springs 31 thus contracts the humps 33 and 35 axially to cause such humps to buckle transversely outwardly against the adjacent flanges 17. It will be appreciated that the relatively gradual slope of the truss sections 83, 85, 91 and 93 with respect to the longitudinal direction of the spring 31 provides a relatively high spring rate upon tightening of the compression screws 37 to thereby provide for a positive wedging of the opposite extremities of the circuit boards against the adjacent mounting flanges 17 to thereby provide for good contact between the heat conductive borders 53 (FIG. 2) and such mounting flanges for good heat dissipation and to provide for positive frictional retainment of such boards in the mounting box 15.

It has been determined that without excessive tightening forces being applied to the screws, a weight of approximately 50 lbs. may be picked up by the circuit boards 13 with both anchors 11 holding the circuit board in position. This feature is particularly important for applications which require resistance to high vibrations and shock.

Figure 8:
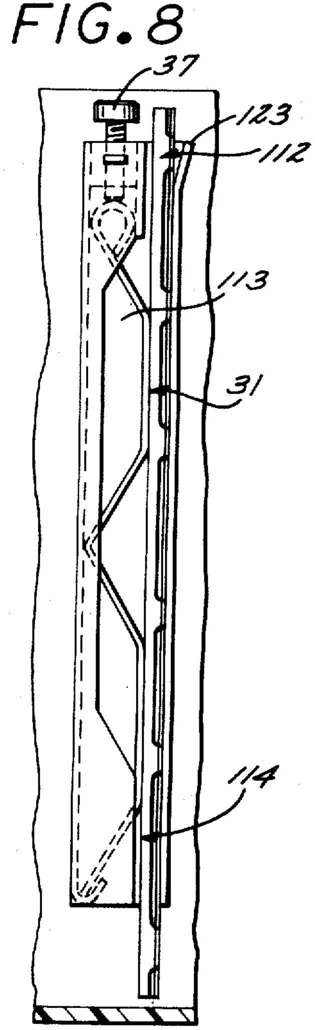
FIG. 8 is a longitudinal sectional view taken along the line 8—8 of FIG. 7.

The circuit board anchor shown in FIGS. 7 and 8 depicts a second embodiment of the present invention and is similar to that shown in FIGS. 4–6. Such anchor includes a housing formed of resilient sheet metal and having a box-like cross section as shown in FIG. 7. The housings are formed to provide an elongated chamber 113 which opens to one side and have their opposite extremities formed with retainers 112 and 114 defined by respective back walls 116 having coextensive side walls 115 and 117 projecting therefrom, the side walls 117 being formed with short inturned lips 119 against which the adjacent circuit board 13 is abutted. The wall 115 projects beyond the end of the circuit boards 13 and then turns back over the marginal edge of the circuit board 13 to form a relatively rigid retaining wall 121. Referring to FIG. 8, the upper extremity of the retaining wall 121 is flared outwardly at 123 to assist in leading the circuit boards 13 into the space defined between such retaining wall 121 and the housing body.

A strut spring 31 identical to the strut spring shown in FIG. 5 is received in the chamber 113 and has a compression screw 37 carried from the retainer 112 urged against the upper extremity thereof.

In operation, the anchors 11 shown in FIGS. 7 and 8 may be mounted from the interior of the unflanged front portion of the side walls of the mounting box 15 by means of rivets 131, care being taken to insure proper positioning of the anchors 111 with respect to the arrays of connector plugs 101 to provide for accurate alignment of the circuit board socket bars 105 with the connector plugs 101 to provide for good electrical contact therewith. With the anchors 111 all being riveted to the side walls of the mounting block in confronting relationship as shown, the circuit board 13 may be fitted downwardly in the opening defined between the retaining walls 121 and bodies of the anchors 111 to the position shown in FIG. 8. The compression screws 37 may then be tightened as described hereinabove with respect to the anchors 111 shown in FIG. 5 to axially compress the strut springs 31 and urge the retaining humps 33 and 35 transversely outwardly against the circuit boards 13 to urge such circuit boards firmly against the respective retaining walls 121 for secure contact therewith.

From the foregoing it will be apparent that the circuit board anchors of the present invention provide an economical and convenient means for mounting circuit boards in a mounting box to provide for efficient heat conduction away from such circuit boards and providing for positive, accurate placement of such circuit board and secure affixing thereof in the mounting boxes.

Obviously, many modifications and variations of the present invention may be made with regard to the foregoing detailed description without departing from the spirit of the invention.

I claim:

1. A circuit board anchor for anchoring an extremity of a circuit board in a circuit board box and comprising:

an elongated beam formed with an elongated chamber having a back wall and open on its front side;

axial retainers on the opposite ends of said beam forming the end walls for said chamber;

snake shaped deformable strut means projecting axially in said chamber and formed with a hump projecting from the open side of said chamber for engagement with said circuit board and having sufficient flexibility to flex upon axial compression thereof to flex said hump a predetermined distance transversely from said open side; and an axial compressing device mounted in one of said retainers and operable to compress said strut means axially inwardly to flex said hump transversely said predetermined distance whereby said beam may be positioned on one side of the margin of said end of said circuit board and said compression device operated to compress said strut means axially to urge said hump transversely outwardly to engage said circuit board and urge it away from said beam to force it against adjacent structure to anchor said end of said circuit board frictionally to said box.

2. A circuit board anchor according to claim 1 wherein said box is formed with pairs of opposed flanges spaced at predetermined spaces therealong and defining said adjacent structure and wherein:

said beam is of sufficient width to, along with the thickness of said circuit board extremity, be received between adjacent flanges and said hump is projectable a sufficient distance transversely from said open side upon operation of said compression device to urge said card against the adjacent said flange.

3. A circuit board anchor according to claim 1 wherein:

said beam is channel shaped to form said chamber and includes side walls having their intermediate portions cut back and taper outwardly away from said back wall adjacent said retainers; and said retainers are in the form of end wall means disposed at opposite ends of said chamber.

4. A circuit board anchor according to claim 1 wherein:

said beam includes a side wall projecting from said back wall and turned inwardly to form a lip confronting said open side and spaced therefrom for receipt therebehind of said one extremity of said board to define said adjacent structure.

5. A circuit board anchor according to claim 1 wherein:

said strut means is in the form of a leaf spring formed with a pair of humps projecting from said open side.

6. A circuit board anchor according to claim 1 wherein:

said strut means is formed to have its opposite extremities engage said back wall, angles outwardly away from said back wall to form a pair of axially spaced apart transversely projecting humps and then turns back inwardly to form an intermediate depression.

7. A circuit board anchor according to claim 1 wherein:

said strut means is in the form of a leaf spring having its opposite extremities abut said retainers, then angles outwardly away from said opposite extremities and away from said back wall and inwardly toward the axial center of said chamber to turn and project parallel to said back wall defining a pair of humps and then turns to angle inwardly toward said back wall to join and form a medial turn-back engaging said back wall to form a support intermediate said humps.

8. A circuit board anchor according to claim 1 wherein:

one of said retainers includes an axially extending through, threaded bore; and said compression device is in the form of a screw screwed through said threaded bore and engaging the end of said strut means.

9. A circuit board anchor according to claim 1 wherein:

one of said retainers is in the form of an end wall having a turned back hook holding one end of said strut means captive and the other retainer includes a fitting formed with a through, threaded bore; and said compression device includes a screw screwed through said bore.

10. A circuit board anchor according to claim 4 that includes:

fastening means for fastening said beam to said box.

* * * * *